(12) United States Patent
Chen et al.

(10) Patent No.: US 7,642,040 B2
(45) Date of Patent: Jan. 5, 2010

(54) METHOD OF FABRICATING PERIODIC DOMAIN INVERSION STRUCTURE

(75) Inventors: Jyh-Chen Chen, Taoyuan (TW); Chang-Hung Chiang, Taipei (TW); Yeeu-Chang Lee, Taoyuan (TW); Cheng-Wei Chien, Taoyuan County (TW)

(73) Assignee: National Central University, Taoyuan (TW)

( * ) Notice: Subject to any disclaimer, the term of this patent is extended or adjusted under 35 U.S.C. 154(b) by 499 days.

(21) Appl. No.: 11/681,791

(22) Filed: Mar. 5, 2007

(65) Prior Publication Data

US 2007/0298334 A1    Dec. 27, 2007

(51) Int. Cl.
G03F 7/20 (2006.01)
G02F 2/02 (2006.01)

(52) U.S. Cl. .................. 430/315; 430/319; 430/321

(58) Field of Classification Search .................. None
See application file for complete search history.

(56) References Cited

U.S. PATENT DOCUMENTS

| | | | |
|---|---|---|---|
| 5,193,023 A | 3/1993 | Yamada et al. | |
| 5,415,743 A | 5/1995 | Harada | |
| 5,652,674 A | 7/1997 | Mizuuchi et al. | |
| 6,998,223 B1* | 2/2006 | Nihei et al. | 430/321 |
| 2004/0207903 A1* | 10/2004 | Apostolopoulos et al. | 359/321 |
| 2006/0049133 A1* | 3/2006 | Chiang et al. | 216/22 |

* cited by examiner

*Primary Examiner*—John A. McPherson
(74) *Attorney, Agent, or Firm*—Jianq Chyun IP Office

(57) ABSTRACT

Providing a fabrication method of a periodic domain inversion structure. A nonlinear optical ferroelectric material substrate is provided. A photoresist layer is formed on the upper and the lower surface of the substrate, and periodic gratings formed by interference of two laser beams are employed to expose the photoresist layer on the upper surface. Meanwhile, the two laser beams pass through the substrate, so the periodic gratings are used to expose the photoresist layer on the lower surface. A development process is performed to form a periodic photoresist pattern on the two surfaces of the substrate. A conductive layer is formed above the substrate for covering the photoresist pattern and the surface of the exposed substrate. The photoresist pattern and a portion of the conductive layer thereon are removed by lift-off. A voltage is applied to the substrate via the remaining conductive layer to polarize parts of the substrate.

18 Claims, 11 Drawing Sheets

METHOD OF FABRICATING PERIODIC DOMAIN INVERSION STRUCTURE

CROSS-REFERENCE TO RELATED APPLICATION

This application claims the priority benefit of Taiwan application serial no. 95122233, filed on Jun. 21, 2006. All disclosure of the Taiwan application is incorporated herein by reference.

BACKGROUND OF THE INVENTION

1. Field of the Invention

The present invention relates to a method of fabricating an optical element, and more particularly to a method of fabricating a periodic domain inversion structure.

2. Description of Related Art

In 1962, Bleombergen et al. proposed a light wavelength conversion technique, wherein a light wavelength conversion element is used to convert a fundamental wave into a second harmonic wave. The light wavelength conversion element is a periodic domain inversion structure having several domains, wherein the domains comprise a spontaneous polarized ferroelectric material, one half of the domains have a polarized direction being opposite to that of the other half of domains, and the two kinds of domains are alternately arranged into a periodic distribution. The application field for such light wavelength conversion element includes a wavelength division multiplexing (WDM) for an optical communication network and red, green and blue laser beams used in displays, and so on.

The formation of domain inversion structure is used a high voltage to drive the movement of the lattice. So the domain must be link properly to electrode with high voltage and can be fabricated through the steps shown in FIGS. 1A-1C. FIGS. 1A-1C are schematic views of a conventional fabrication method of a periodic domain inversion structure. First, referring to FIG. 1A, a nonlinear optical ferroelectric material substrate 100 is provided and coated a photoresist layer 102. A photo mask 103 is disposed over the photoresist layer 102. Then, Referring to FIG. 1B, the periodic photoresist pattern 102a is formed through an optical lithography process. Next, referring to FIG. 1C, a periodic pulse voltage $V_p$ is applied to the substrate 100 with the exposed parts of the substrate such that the electric field formed by the pulse voltage $V_p$ controls the spontaneous polarization direction of the substrate 100, thus, the substrate 100 is divided into domains 100a and domains 100b, wherein the domains 100a have a polarization direction of P+, the domains 100b have a polarization direction of P−, and the polarization directions of P+ and P− are opposite to each other. Thus, the substrate 100 becomes a periodic domain inversion structure.

The periodic photoresist pattern can be fabricated through optical lithography process with mask aligner, however such equipment is very difficult to fabricate the short periodic photoresist patterns. And it must be applied to exposing apparatus such as a stepper or a scanner, thus, the manufacturing cost is relatively high. In addition, as the Internet and the electronic science and technology prevail, the demand for simplicity and low cost periodic domain inversion structures has gradually increased, and is highly desirable for manufacturers in this field.

SUMMARY OF THE INVENTION

A method is provided for fabricating periodic domain inversion structures, capable of reducing the manufacturing cost.

The present invention provides a method of fabricating a periodic domain inversion structure, which comprises the following steps. First, a substrate, which is a nonlinear optical ferroelectric material, is provided. Next, photoresist layers are formed on an upper surface and a lower surface of the substrate, and periodic gratings formed by interference of two laser beams are employed to expose the photoresist layers on the upper surface of the substrate. Meanwhile, two laser beams pass through the substrate, so the periodic gratings are used to expose the photoresist layer on the lower surface of the substrate. Next, a development process is performed, such that periodic photoresist patterns are formed on the upper surface and the lower surface of the substrate. Next, a conductive layer is formed on the substrate, for covering the photoresist pattern and exposed substrate surface. Thereafter, the photoresist layer and a portion of the conductive layer thereon are removed by lift-off technique, and then, a voltage is applied to the substrate via the remaining conductive layer to polarize parts of the substrate.

The present invention further provides a fabrication method of a periodic domain inversion structure, which comprises the following steps. First, a substrate, which is a nonlinear optical ferroelectric material, is provided. Next, photoresist layers are formed on an upper surface and a lower surface of the substrate, and several periodic gratings formed by interference of two laser beams are employed to expose the photoresist layer on the upper surface of the substrate. Meanwhile, two laser beams pass through the substrate, so the periodic gratings are used to expose the photoresist layer on the lower surface of the substrate. Then, a development process is performed, such that periodic photoresist patterns are formed on the upper surface and the lower surface of the substrate. Then, a dielectric layer is formed on the substrate, for covering the photoresist pattern and exposed substrate surface. Thereafter, the photoresist layer and a portion of the conductive layer thereon are removed by lift-off technique, and then, a conductive layer is formed on the upper surface and the lower surface of the substrate, for covering the remaining dielectric layer and the exposed substrate surface. Then, a voltage is applied to the substrate via the remaining conductive layer to polarize parts of the substrate.

According to the present invention, the conductive layer is defined by using laser interference lithography instead of an ordinary optical lithography process for reducing the manufacturing cost. In addition, the photoresist layer on the upper surface and the lower surface of the substrate are exposed in one process, instead of being exposed separately in two process, thus, the cost of the exposing process can be further reduced.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The present invention utilizes a laser interference lithography instead of an ordinary optical lithography process. Compared with the equipments of ordinary optical lithography process such as a stepper or a scanner, the manufacturing cost of the periodic domain inversion structure can be controlled effectively since the cost for purchasing the laser interference lithography equipments is relatively low. In addition, when performing the laser interference lithography to one substrate, the light beam passes through the substrate, so as to expose both surfaces of the substrate. Such feature of the present invention also effectively reduces the steps of the manufacturing process, which is illustrated below in greater detail.

First Embodiment

Figure 1A:
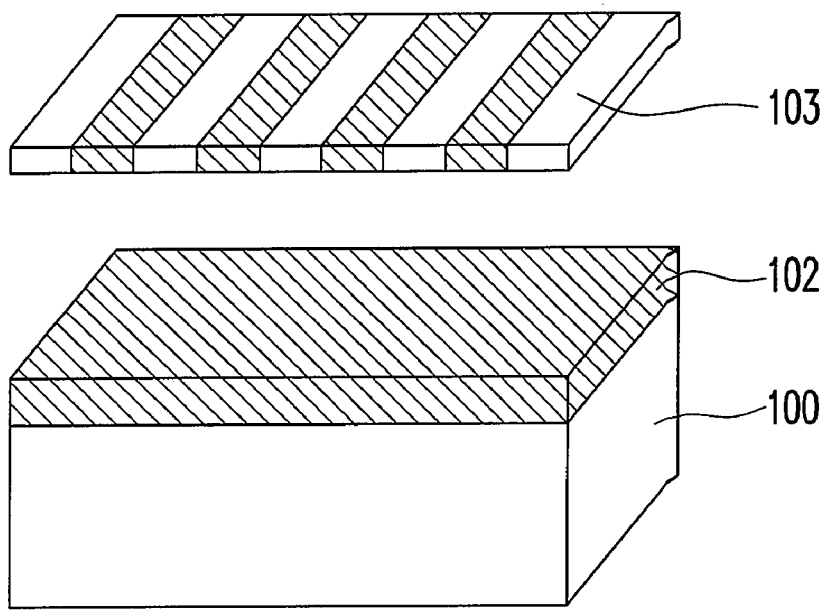
FIGS. 1A-1C are schematic views of a conventional method of fabricating a periodic domain inversion structure.
Figure 1B:
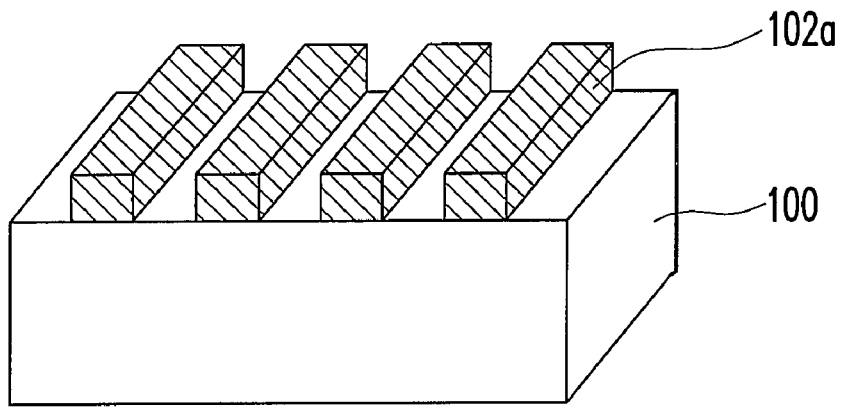
Figure 1C:
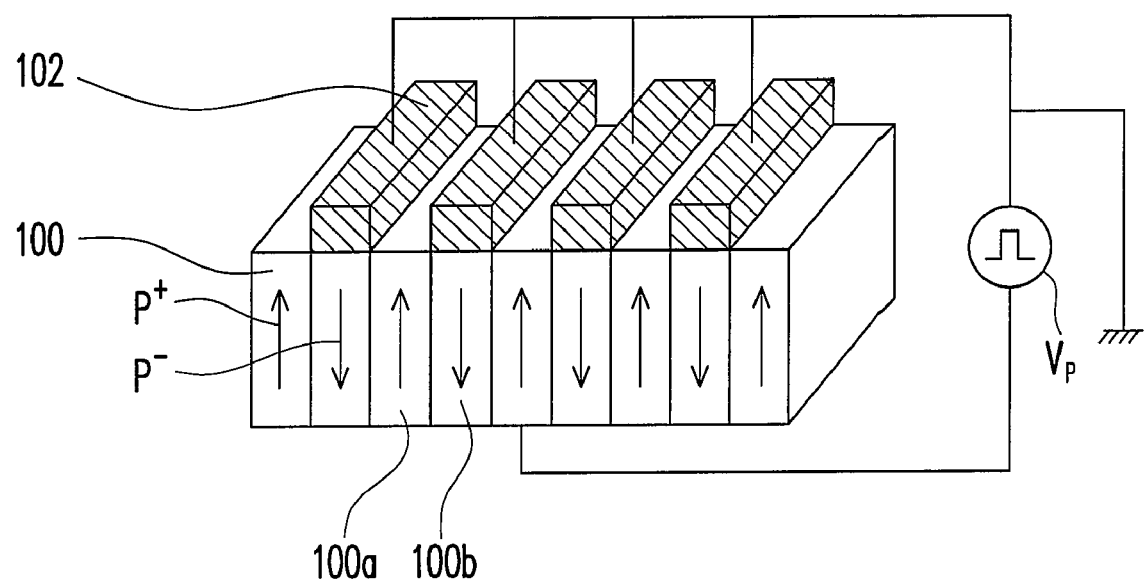
Figure 2A:
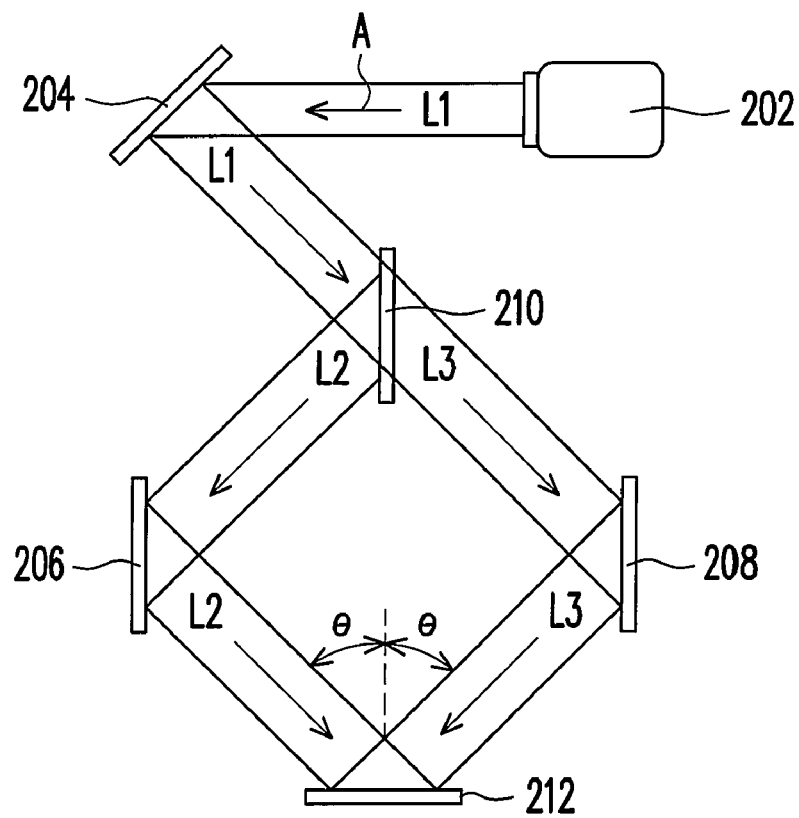
FIG. 2A is a schematic view of a laser interference lithography equipment.
Figure 2B:
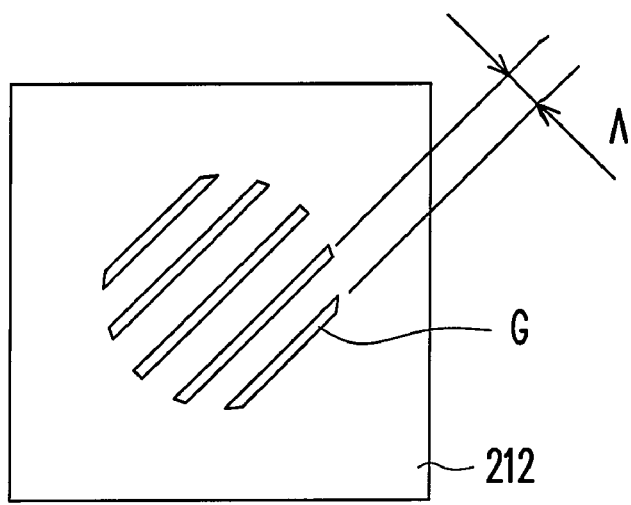
FIG. 2B is a top view of a platform for a laser interference lithography equipment in FIG. 2A.

As for the laser interference lithography, for example, one laser beam is collimated, and then two laser beams are produced through the splitter and reflector. Next, the two laser beams are interfered with each other to generate periodic interference gratings used for the exposing process. The working principle of the laser interference lithography equipments is illustrated below with reference to FIGS. 2A and 2B. FIG. 2A is a schematic view of a laser interference lithography equipment, and FIG. 2B is a top view of a platform of the laser interference lithography equipment in FIG. 2A. However, it should be understood that, other similar laser interference lithography equipments may also be used in the method of the present invention.

Referring to both FIG. 2A and FIG. 2B, a laser interference lithography equipment 200 comprises a light source 202, reflectors 204, 206, 208 and a splitter 210. The directions indicated by arrows A are the traveling directions of the laser beams. During the exposing process, the light source 202 generates a laser beam L1. Next, the laser beam L1 is reflected to the splitter by the reflector 204, such that laser beams L2 and L3 are generated. Next, the laser beams L2 and L3 are reflected by the reflectors 206 and 208 and then interfere with each other, thus, parallel periodic gratings G used in the exposing process are formed at the platform 212. The wavelength of the laser beams L1, L2 and L3 is, for example, 190 nm-600 nm. That is because the laser beams L1, L2 and L3 with the wavelength being lower than 190 nm are easily absorbed by ferroelectric material, the material of the periodic domain inversion structure, and therefore cannot pass through the substrate as mentioned above. In addition, if the wavelength of the laser beams L1, L2 and L3 is larger than 600, the periodic gratings G make most kinds of photoresist not photo-sensitive.

Furthermore, the period $\Lambda$ of the periodic gratings G satisfies the following equation (1):

$$\Lambda = \lambda/2 \sin \theta \qquad (1),$$

wherein $\lambda$ is the wavelength of the laser beams L1, L2 and L3; $\theta$ is a half of the angle between the laser beams L2 and L3. The period $\Lambda$ of the periodic grating G can be changed by adjusting the wavelength $\lambda$ and the angle between the laser beams L2 and L3. In this embodiment, the angle between the laser beams L2 and L3 is, for example, larger than 0 degrees and smaller than 180 degrees, and the period $\Lambda$ is, for example, 0.2-50 μm.

Next, the method of fabricating the periodic domain inversion structure of the present invention is illustrated below.

FIGS. 3A-3E are schematic views for a flow of a method of fabricating a periodic domain inversion structure according to a first embodiment of the present invention. First, referring to FIG. 3A, a substrate 300 is provided. The substrate 300 is a nonlinear optical ferroelectric material, which is a material with the properties of ferroelectric material and presenting apparent nonlinear optical effect. In this embodiment, the nonlinear optical ferroelectric materials are, for example, congruent $LiNbO_3$, MgO doped congruent $LiNbO_3$, stoichiometric $LiNbO_3$, MgO doped stoichiometric $LiNbO_3$ congruent $LiTaO_3$ MgO doped congruent $LiTaO_3$ stoichiometric $LiTaO_3$, MgO doped stoichiometric $LiTaO_3$. Next, photoresist layers 302 and 304 are formed on an upper surface and a lower surface of the substrate 300 respectively. The photoresist layers 302 and 304 are formed, for example, by coating photoresist twice through a spin coater, and then performing essential photoresist baking processes. Next, the substrate 300 is placed on a platform 212, and then, periodic gratings G formed by a laser interference lithography equipment 200 are used to expose the photoresist layers 302 and 304. The two laser beams L2 and L3 pass through the substrate 300, and then the periodic gratings G are used to expose the photoresist layer 304 on the lower surface of the substrate 300. In addition, during the exposing process, the substrate 300 could be translated to form a large area periodic pattern or rotated to do multiple exposures to form two dimension periodical pattern, so as to expose the whole photoresist layers 302 and 304 on the substrate 300. The substrate 300 is translated or rotated, for example, under the control of a stepping motor, and the rotating angle of the substrate 300 is larger than 0 degrees or smaller than 180 degrees.

Figure 3A:
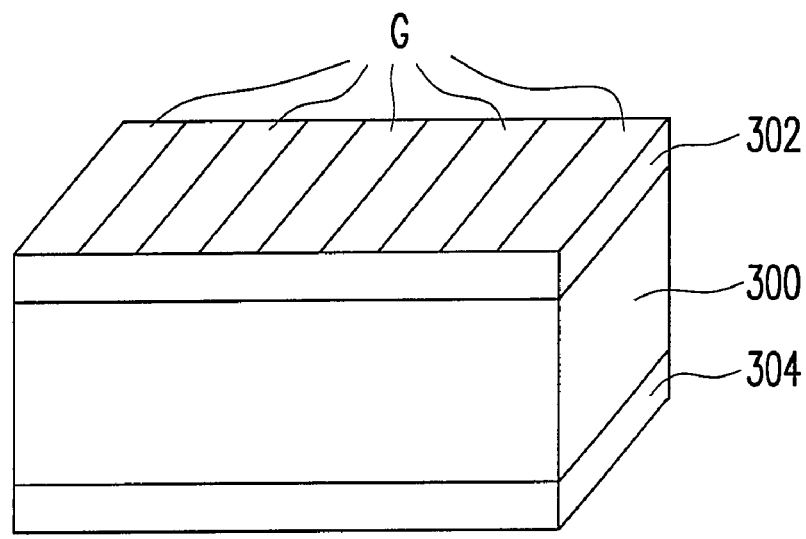
FIGS. 3A-3E are schematic views of a flow of a method of fabricating a periodic domain inversion structure according to a first embodiment of the present invention.
Figure 3B:
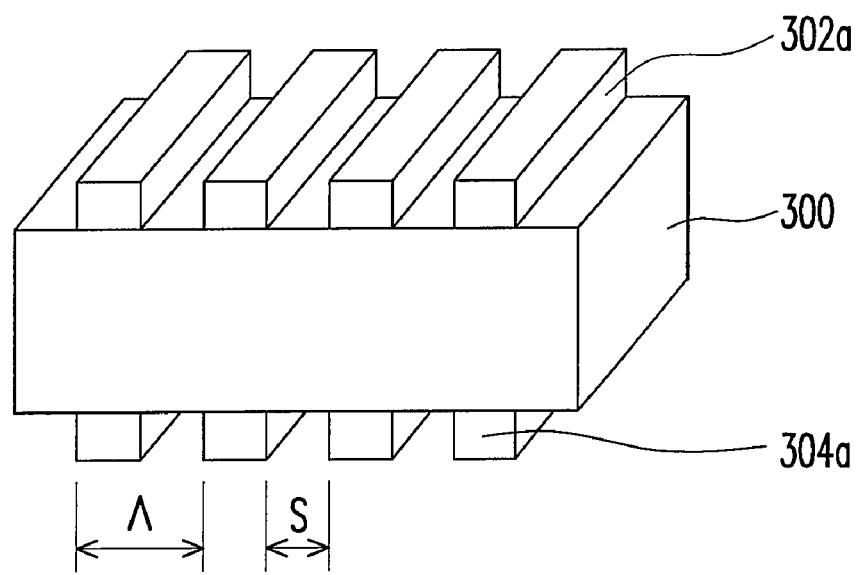

Next, referring to FIG. 3B, a development process is performed to form periodic photoresist patterns 302a and 304a on the upper surface and the lower surface of the substrate 300 respectively. Since the period $\Lambda$ of the periodic grating G is 0.2-50 μm, the period of the photoresist patterns 302a and 304a is also 0.2-50 cm. As shown by FIG. 3B, in this embodiment, the periods of the photoresist patterns 302a and 304a are the same. However, the present invention is not limited to this. Particularly, when the photoresist patterns 302a and 304a are exposed, the period $\Lambda$ of the periodic grating G may vary. Furthermore, the space S between the photoresist patterns 302a and 302b is, for example, 0.1-25 μm. The space S also can be controlled by the intensity of the periodic grating G and the exposure time. More particularly, the higher the intensity of the periodic grating G or the longer the exposure time, the larger the space S is.

Figure 4:
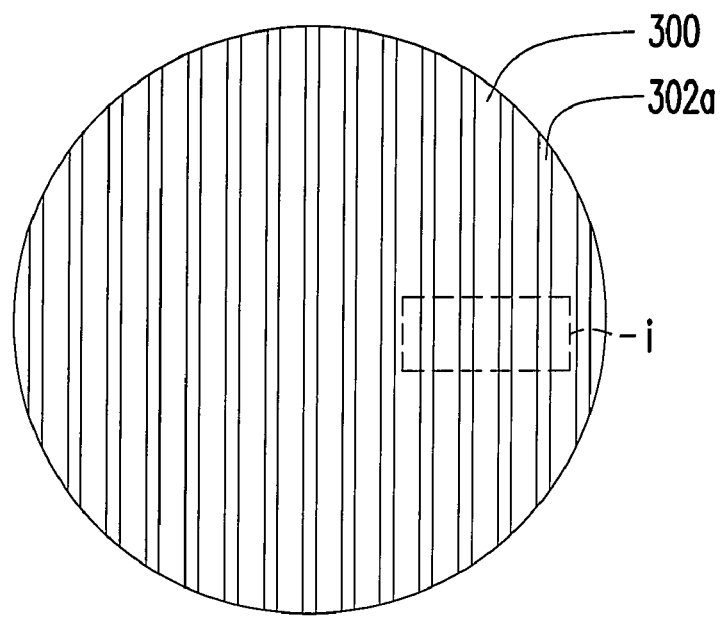
FIG. 4, FIG. 5 and FIG. 6 are shapes of a photoresist pattern after the development process.
Figure 5:
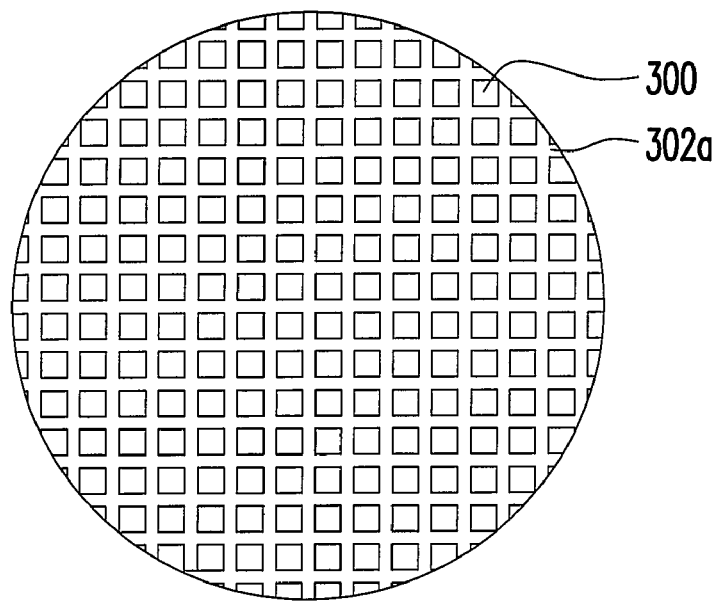
Figure 6:
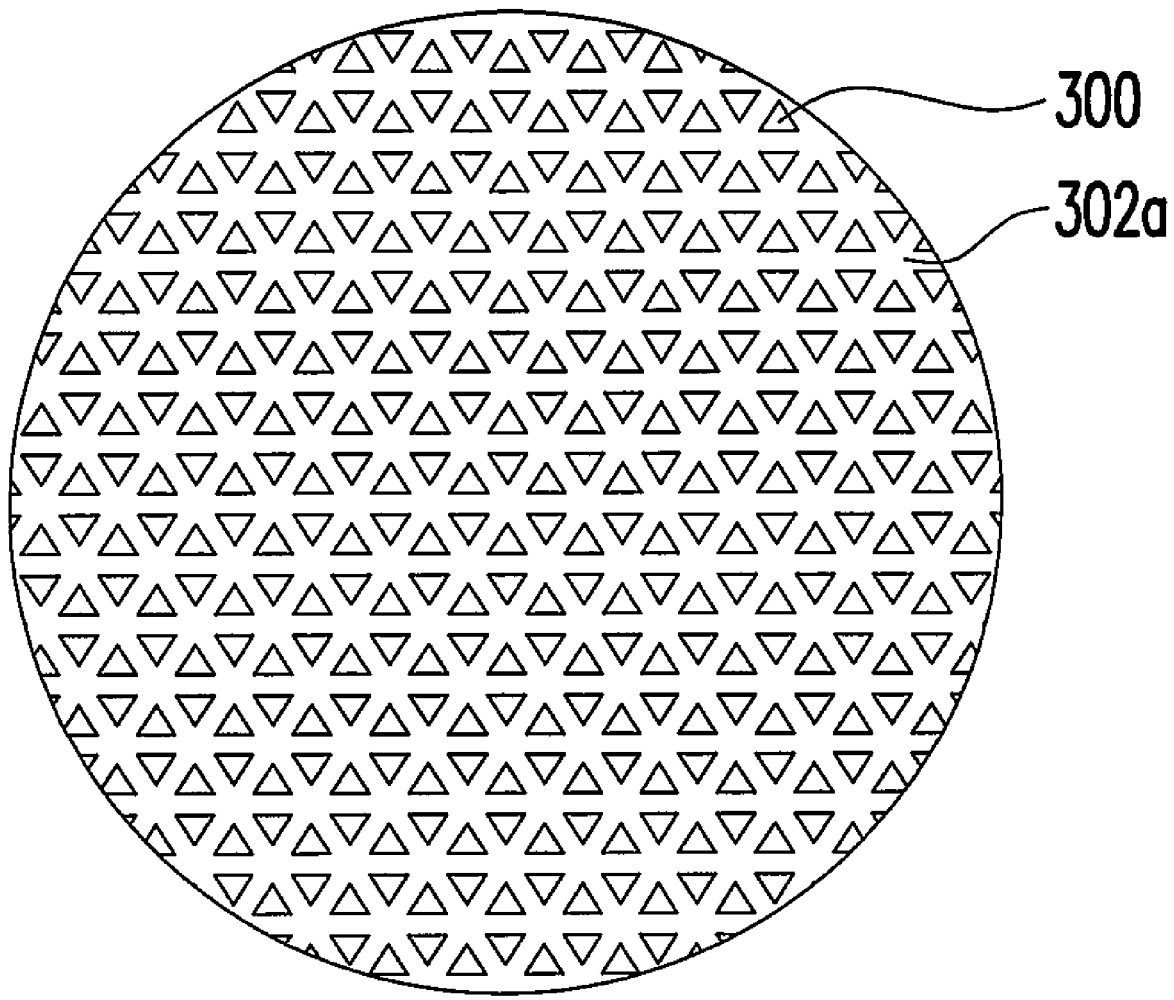

The shapes of the photoresist patterns 302a and 302b after the development process are illustrated below in FIG. 4, FIG. 5 and FIG. 6. FIG. 4 is a top view of a substrate and a photoresist pattern in this embodiment. FIGS. 5 and 6 are top views of a substrate and a photoresist pattern according to another embodiment of the present invention. In addition, the marked area i in FIG. 4 is the top view of FIG. 3B.

Referring to FIG. 4, in this embodiment, the shape of the photoresist patterns 302a and 304a (not shown) is a periodic stripe. Next, referring to FIGS. 5 and 6, in another embodiment of the present invention, the photoresist patterns 302a and 304a may also be net-shaped. However, the shape of the above photoresist patterns is not limited in the present invention. Particularly, since the periodic interference gratings are used to expose the photoresist layers 302 and 304, the photoresist patterns 302a and 304a may be any periodic or repeated patterns, for example, the shape of island.

Figure 3C:
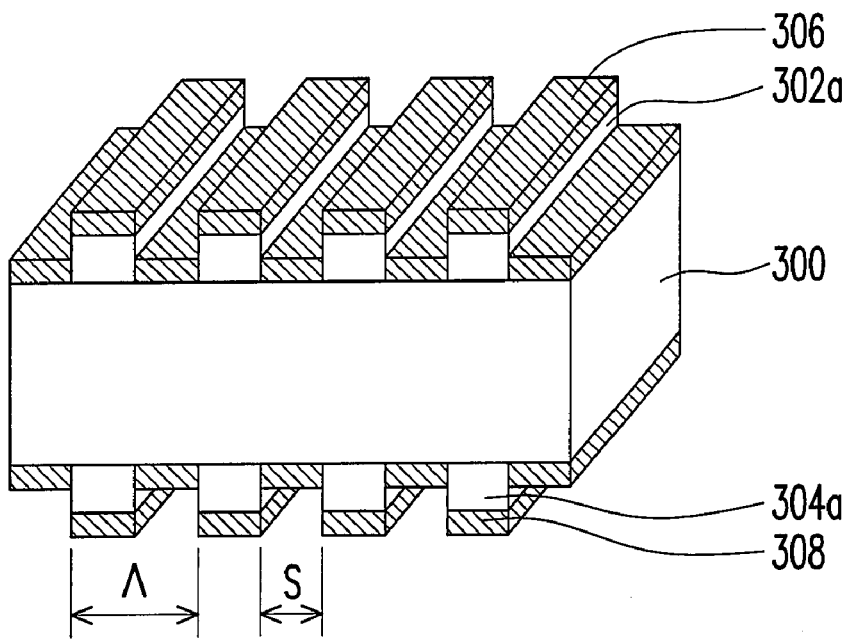

Next, referring to FIG. 3C, a conductive layer 306 is formed on the upper surface of the substrate 300 for covering the photoresist pattern 302a and a part the exposed upper surface of the substrate 300. Meanwhile, a conductive layer 308 is formed on the lower surface of the substrate 300 for covering the photoresist pattern 302b and the exposed lower surface of the substrate 300. The conductive layers 306 and 308 are, for example, metals with high melting point, including Pt, W, Ta, Ti, Indium Tin Oxide (ITO), ZnO or SnO etc. In addition, the conductive layers 306 and 308 are formed by physical vapor deposition and chemical vapor deposition.

Figure 3D:
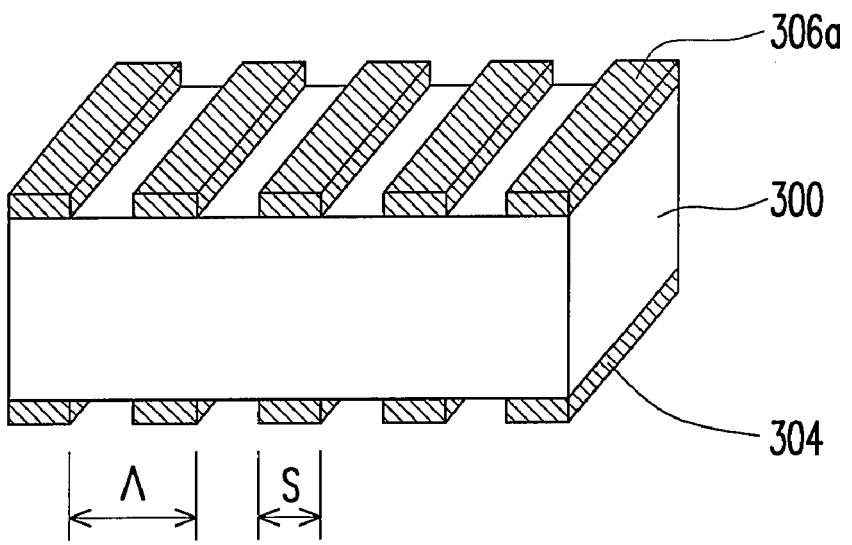
Figure 3E:
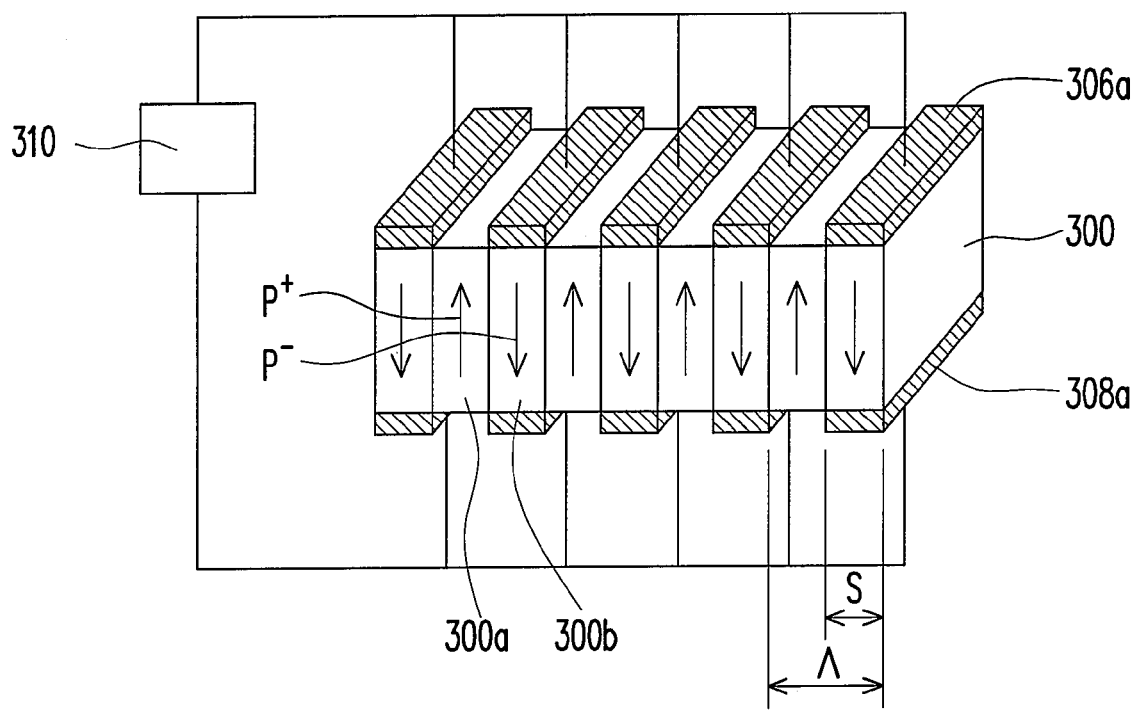

Then, referring to FIG. 3D, the photoresist patterns 302a and 304a and a part of the conductive layers 306 and 308 thereon are removed by lift-off, leaving the remaining conductive layers 306a and 308a. Then, referring to FIG. 3E, a voltage is applied to the substrate 300, so as to polarize a part of the substrate 300. The manner of applying the voltage to the substrate 300 includes, for example, a DC power supply 310 is provided, then, the remaining conductive layers 306a and 308a are used as electrodes to be electrically connected to the positive pole and the negative pole of the DC power source 310, thereby applying a voltage to the substrate 300. Of course, the voltage signal of applying a voltage to the substrate 300 is not limited to a DC signal. Particularly, the voltage signal may be a DC signal, a pulse signal, or any signal combination thereof. In addition, when applying a voltage, the substrate 300 may be heated up to 100-1200° C. in an atmospheric environment or an oxygen-contained environment, for reducing the intensity of the coercive electric field (Ec). Additionally, the voltage applied by the DC power source is, for example, about tens to thousands of volts per centimeter. Thus, the substrate 300 is divided into domains 300a and 300b having polarization directions of e.g., P+ and P− respectively, wherein the period Λ is equal to the sum of the widths of the domains 300a and 300b, which is, for example, between 0.2 and 50 μm. The width of the remaining conductive layers 306a and 308a is equal to the space S between the photoresist patterns 302a and 304a, which is, for example, between 0.1 μm and 25 μm. Till the current process, the substrate 300 has become a periodic domain inversion structure. Then, the remaining conductive layers 306a and 308a may be removed.

The application that the periodic conductive layer patterns to be defined by the parallel periodic gratings generated by utilizing the laser interference lithography has been illustrated above. Then, another application manner of this method will be illustrated below through a second embodiment.

Second Embodiment

FIGS. 7A-7F are schematic views of a flow of a method of fabricating a periodic domain inversion structure according to a second embodiment of the present invention. In the following description, the elements being the same as those in the first embodiment are marked by the same referential numerals, and only the part that is different from the first embodiment are illustrated, the repeated descriptions are omitted herein.

Figure 7A:
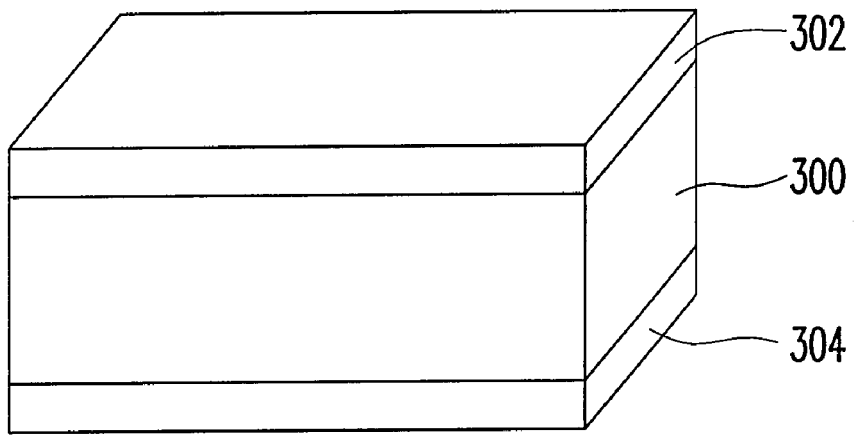
FIGS. 7A-7F are schematic views of a flow of a method of fabricating a periodic domain inversion structure according to a second embodiment of the present invention.
Figure 7B:
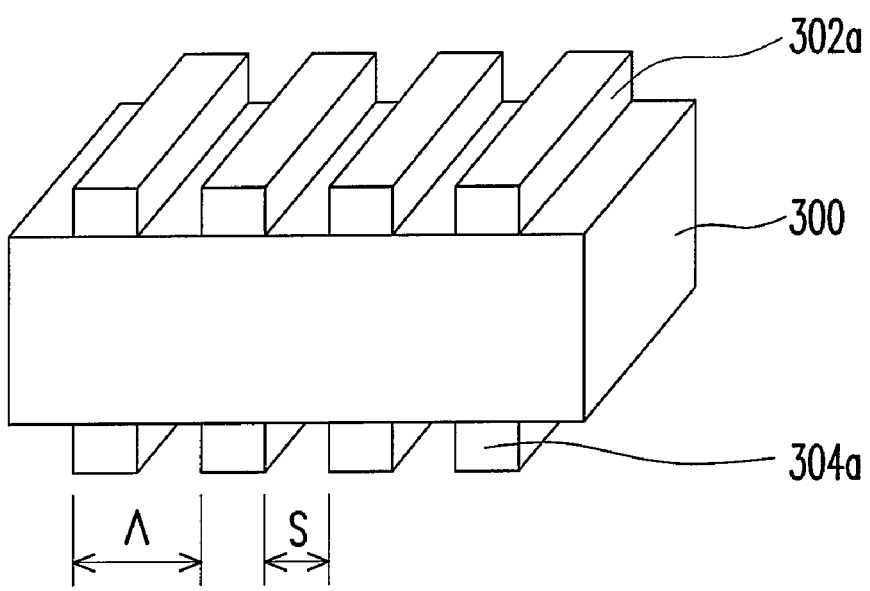
Figure 7C:
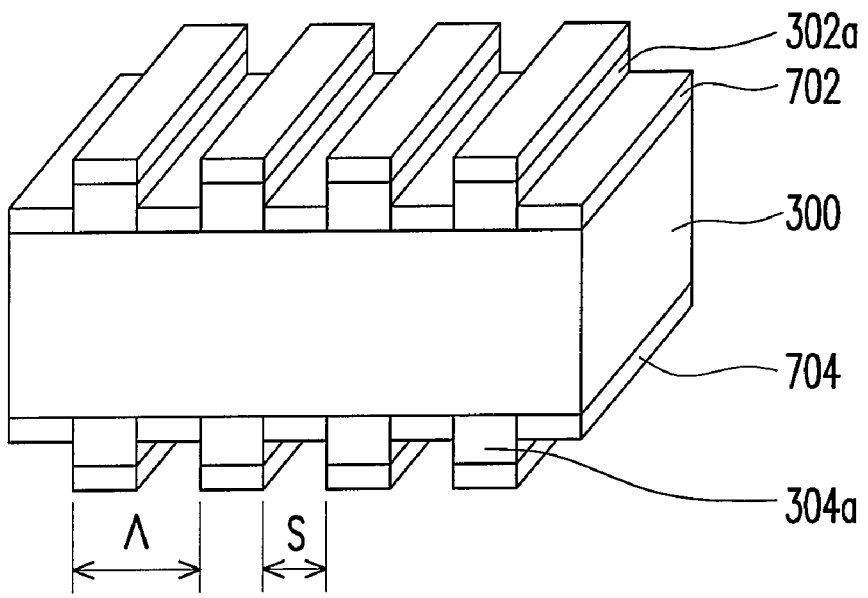

First, referring to FIG. 7A, a substrate 300 is provided and coated photoresist layers 302, 304. Then, Referring to FIG. 7B, after exposing by a laser interference lithography equipment, photoresist patterns 302a and 304a are formed on an upper surface and a lower surface of the substrate 300 respectively. Next, referring to FIG. 7C, dielectric layers 702 and 704 are formed on the substrate 300, for covering the photoresist pattern 302a, 304a and the exposed upper and lower surfaces of the substrate 300. The material of the dielectric layers 702 and 704 is, for example, a material being stable under a high temperature environment, such as $Al_2O_3$, SiN or $SiO_2$.

Figure 7D:
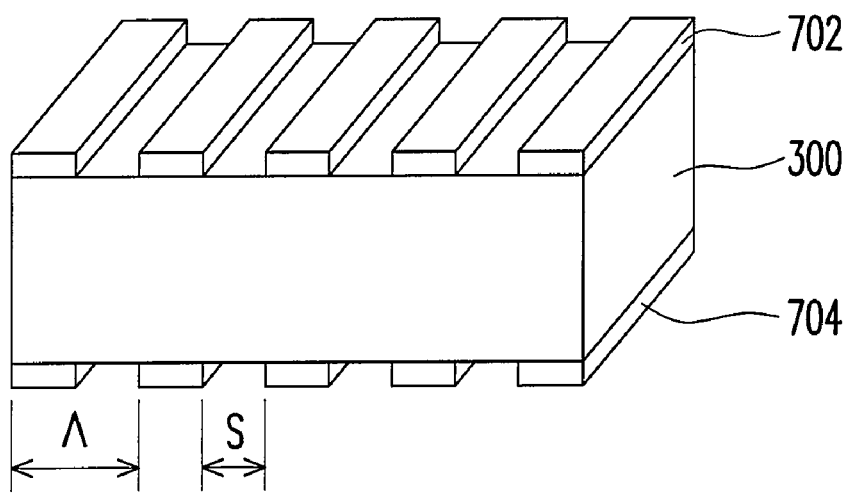
Figure 7E:
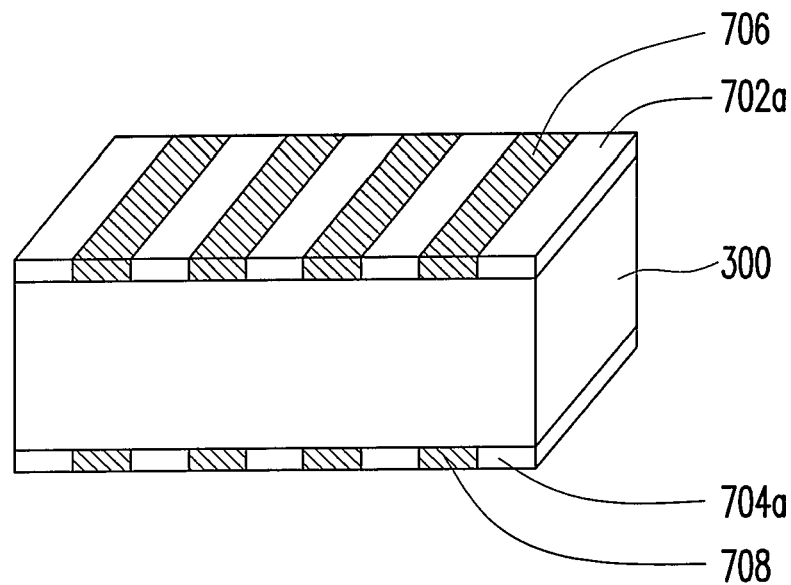
Figure 7F:
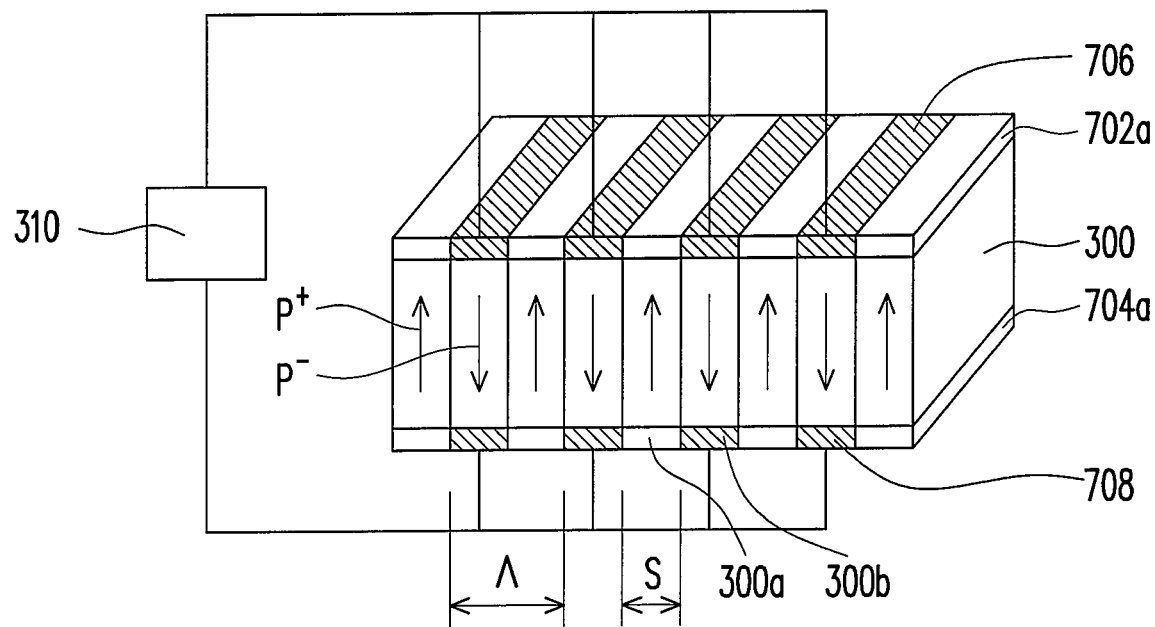

Next, referring to FIG. 7D, the photoresist pattern 302a, 304a and a part of the dielectric layers 702 and 704 thereon are removed by lift-off, and there are also remaining dielectric layers 702a and 704a on the upper surface and the lower surface of the substrate 300, and a part of the upper surface and the lower surface of the substrate 300 is exposed. Next, referring to FIG. 7E, conductive layers 706 and 708 are formed on the upper surface and the lower surface of the substrate 300 respectively, for covering the remaining dielectric layers 702a, 704a and the surface of the exposed substrate 300 respectively. Next, referring to FIG. 7F, a voltage is applied to the upper surface and the lower surface of the substrate 300 via the conductive layers 706 and 708, so as to polarize parts of the substrate 300. The method of applying the voltage is, for example, electrically connecting the conductive layers 706 and 708 to the DC power source 310. Of course, the applied voltage signal may be a DC signal, a pulse signal or any signal combination thereof. Till this step, the substrate 300 has become a periodic domain inversion structure. Then, the conductive layers 706 and 708, and the remaining dielectric layers 702a and 704a are removed.

To sum up, the fabrication method of a periodic domain inversion structure in the present invention utilizes the laser interference lithography to define the conductive layer patterns instead of the ordinary optical lithography process. Since no expensive equipments such as stepper or scanner are required, the fabricating cost is effectively reduced. In addition, since the photoresist patterns on the upper surface and lower surface of the substrate are defined through one exposure step, the cost of the exposing process is further reduced. According to another aspect of the present invention, since the space and period of the two photoresist patterns for the upper surface and the lower surface are defined in one exposure step, the fabrication method of the present invention not only reduces the fabrication cost but also simplifies the fabrication process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method of a periodic domain inversion structure, comprising:
   providing a substrate, wherein the substrate is a nonlinear optical ferroelectric material;
   forming a photoresist layer on an upper surface and a lower surface of the substrate;
   exposing the photoresist layer on the upper surface of the substrate by using a plurality of periodic gratings formed by interference of two laser beams and exposing the photoresist layer on the lower surface of the substrate by using the gratings formed by the two laser beams passing through the substrate;
   performing a development process to form a periodic photoresist pattern on the upper surface and the lower surface of the substrate;
   forming a conductive layer on the substrate to cover the photoresist pattern and the exposed substrate surface;
   removing the photoresist pattern and a portion of the conductive layer thereon by a lift-off technique; and
   applying a voltage to the substrate via the remaining conductive layer to polarize parts of the substrate.

2. The fabrication method of a periodic domain inversion structure as claimed in claim 1, wherein the substrate is translated or rotated during the exposure process.

3. The fabrication method of a periodic domain inversion structure as claimed in claim 2, wherein the rotation angle of the substrate is larger than 0 degree and smaller than 180 degrees.

4. The fabrication method of a periodic domain inversion structure as claimed in claim 1, wherein the shape of the photoresist pattern comprises a periodic stripe, net or island.

5. The fabrication method of a periodic domain inversion structure as claimed in claim 1, wherein the wavelength of the laser beam is in a range of 190 nm-600 nm.

6. The fabrication method of a periodic domain inversion structure as claimed in claim 1, wherein an angle of the two laser beams is larger than 0 degree and smaller than 180 degrees.

7. The fabrication method of a periodic domain inversion structure as claimed in claim 1, wherein a period of the photoresist pattern is in a range of 0.2 µm-50 µm.

8. The fabrication method of a periodic domain inversion structure as claimed in claim 1, wherein a space of the periodic photoresist pattern is in a range of 0.1 µm-25 µm.

9. The fabrication method of a periodic domain inversion structure as claimed in claim 1, wherein the step of forming the conductive layer comprises a physical vapor deposition process or a chemical vapor deposition process.

10. A fabrication method of a periodic domain inversion structure, comprising:
    providing a substrate, wherein the substrate is a nonlinear optical ferroelectric material;
    forming a photoresist layer on an upper surface and a lower surface of the substrate;
    exposing the photoresist layer on the upper surface of the substrate by using a plurality of periodic gratings formed by interference of two laser beams and exposing the photoresist layer on the lower surface of the substrate by using the gratings formed by the two laser beams passing through the substrate;
    performing a development process to form a periodic photoresist pattern on the upper surface and the lower surface of the substrate;
    forming a dielectric layer on the substrate to cover the photoresist pattern and the exposed substrate surface;
    removing the photoresist pattern and a portion of the dielectric layer thereon by a lift-off technique;
    forming a conductive layer on the upper surface and the lower surface of the substrate to cover a remaining dielectric layer and the exposed substrate surface; and
    applying a voltage to the substrate via the conductive layer to polarize parts of the substrate.

11. The fabrication method of a periodic domain inversion structure as claimed in claim 10, wherein the substrate is translated or rotated during the exposing process.

12. The fabrication method of a periodic domain inversion structure as claimed in claim 11, wherein a rotation angle of the substrate is larger than 0 degree and smaller than 180 degrees.

13. The fabrication method of a periodic domain inversion structure as claimed in claim 10, wherein a shape of the photoresist pattern comprises a periodic stripe, net or island.

14. The fabrication method of a periodic domain inversion structure as claimed in claim 10, wherein a wavelength of the laser beam is in a range of 190 nm-600 nm.

15. The fabrication method of a periodic domain inversion structure as claimed in claim 10, wherein an angle of the two laser beams is larger than 0 degree and smaller than 180 degrees.

16. The fabrication method of a periodic domain inversion structure as claimed in claim 10, wherein a period of the photoresist pattern is in a range of 0.2 µm-50 µm.

17. The fabrication method of a periodic domain inversion structure as claimed in claim 10, wherein a space of the periodic photoresist pattern is in a range of 0.1 µm-25 µm.

18. The fabrication method of a periodic domain inversion structure as claimed in claim 10, wherein the step of forming the conductive layer comprises a physical vapor deposition process or a chemical vapor deposition process.

* * * * *